United States Patent
Chu et al.

(10) Patent No.: US 6,714,412 B1
(45) Date of Patent: Mar. 30, 2004

(54) SCALABLE COOLANT CONDITIONING UNIT WITH INTEGRAL PLATE HEAT EXCHANGER/EXPANSION TANK AND METHOD OF USE

(75) Inventors: Richard C. Chu, Hopewell Junction, NY (US); Michael J. Ellsworth, Jr., Lagrangeville, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/243,708

(22) Filed: Sep. 13, 2002

(51) Int. Cl.[7] ................................................. H05K 7/20
(52) U.S. Cl. ...................... 361/699; 62/259.2; 165/80.4; 165/104.33; 165/157; 361/701; 361/831
(58) Field of Search ........................... 165/80.4, 104.19, 165/104.21, 104.33, 157–168; 174/15.1; 257/714; 62/259.2; 361/687–689, 696, 698–701, 831

(56) References Cited

U.S. PATENT DOCUMENTS

| | | | |
|---|---|---|---|
| 4,394,141 A | 7/1983 | Cadars et al. | 55/195 |
| 4,567,223 A | 1/1986 | Ames | 524/489 |
| 4,729,424 A | 3/1988 | Mizuno et al. | 165/30 |
| 4,854,382 A | 8/1989 | Funke | 165/167 |
| 5,050,036 A | 9/1991 | Oudick et al. | 361/385 |
| 5,086,829 A | 2/1992 | Asakawa | 165/12 |
| 5,323,847 A * | 6/1994 | Koizumi et al. | 165/104.33 |
| 5,370,178 A | 12/1994 | Agonafer et al. | 165/137 |
| 5,394,936 A | 3/1995 | Budelman | 165/104.33 |
| 5,482,113 A | 1/1996 | Agonafer et al. | 165/137 |
| 5,523,640 A | 6/1996 | Sparer et al. | 310/64 |
| 5,620,646 A | 4/1997 | Sparer et al. | 264/328.14 |
| 5,630,326 A | 5/1997 | Nishishita et al. | 62/299 |
| 5,646,824 A * | 7/1997 | Ohashi et al. | 361/699 |
| 5,731,954 A * | 3/1998 | Cheon | 361/699 |
| 5,744,008 A | 4/1998 | Craven | 202/83 |
| 5,871,042 A | 2/1999 | Gutfeldt et al. | 165/70 |
| 5,943,211 A * | 8/1999 | Havey et al. | 361/699 |
| 6,122,166 A | 9/2000 | Mochizuki et al. | 361/687 |
| 6,182,742 B1 | 2/2001 | Takahashi et al. | 165/104.33 |
| 6,628,520 B2 * | 9/2003 | Patel et al. | 165/80.4 |

FOREIGN PATENT DOCUMENTS

| | | |
|---|---|---|
| JP | 58148394 A | 9/1983 |
| JP | 63205536 A | 8/1988 |
| JP | 4257011 A | 9/1992 |
| JP | 9184667 | 7/1997 |
| JP | 10220982 A | 8/1998 |
| WO | WO8704781 A | 8/1987 |
| WO | WO0165900 A1 | 9/2001 |

OTHER PUBLICATIONS

Baumann et al., Optimized Cooling Systems for Semiconductor Devices, IEEE, 0–7803–4503–7/98, pp. 2336–2341.
Lee et al., "Compact Liquid Cooling System for Small, Moveable Electronic Equipment," IEEE, CH3095–7/92, pp. 30–36.
Matsumoto et al., "Design Study of Cooling Water System for a Large Scale Linear Collider," IEEE, 0–7803–4376–X/98, pp. 581–583.
Pending patent application Ser. No. 09/893,135, Filed Aug. 17, 2001, Assigned to IBM.

* cited by examiner

*Primary Examiner*—Gregory D Thompson
(74) *Attorney, Agent, or Firm*—Andrew J. Wojnicki, Jr.

(57) ABSTRACT

A scalable coolant conditioning unit (SCCU) is designed to accommodate removable modular pumping units (MPU's). The MPU's may comprise one or a plurality of pump/pump motor combinations. The MPU's are connected to coolant supply and discharge mechanisms by an insertion facilitation mechanism comprising an automatic coupling assembly and an isolation valve mechanism and are placed into and removed from the SCCU body with the aid of a seating mechanism. MPU's are added to an operating SCCU as needed to support increased heat loads of electronics frames. A plate heat exchanger is physically integrated within the expansion tank, reducing volumetric requirements for the SCCU and is sized to accommodate the maximum heat load.

19 Claims, 11 Drawing Sheets

SCALABLE COOLANT CONDITIONING UNIT WITH INTEGRAL PLATE HEAT EXCHANGER/EXPANSION TANK AND METHOD OF USE

FIELD OF THE INVENTION

The present invention relates in general to the cooling of computer electronic components by liquid systems. More particularly, the invention relates to a scalable design for liquid cooling of electronics systems, utilizing removable modular pumping units and an integrated plate heat exchanger/expansion tank.

BACKGROUND OF THE INVENTION

Figure 1:
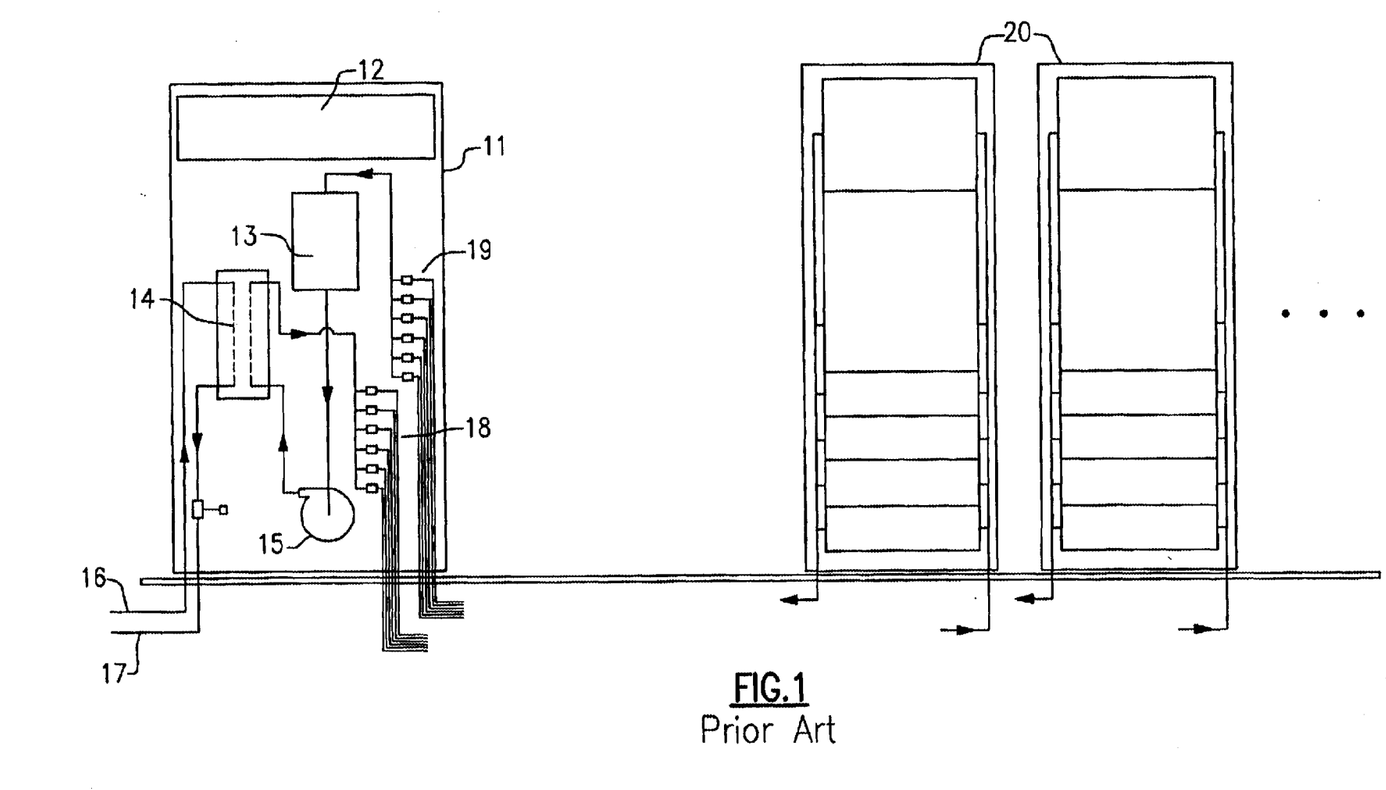
FIG. 1 is a cooling distribution unit of the prior art.

Heat fluxes dissipated by electronic equipment, such as microprocessors and power supplies, are reaching levels that preclude air cooling as a means to control component temperature. Liquid cooling (e.g. water cooling) is a very attractive technology to manage the higher heat fluxes. The liquid absorbs the heat dissipated by the components/modules in a very efficient matter (i.e. with minimal rise from the liquid to the component being cooled). The heat ultimately has to be transferred from the liquid and out of the data center (i.e. room containing the electronic equipment) environment, otherwise, the liquid would continuously rise in temperature. From the 1970s through the early 1990s, IBM accomplished this task back by circulating the cooling liquid (i.e. system water) via a coolant distribution unit (FIG. 1). The system water would flow through a liquid/liquid heat exchanger that was cooled by relatively low temperature water, known as site service or customer water, which was provided by the customer facility. This unit stood separate from the electronics frames and would supply system water (maintained at about 22 C) to one or more electronics frames.

Back when the cooling distribution unit (CDU) was used, a single computer system could fill the entire data center. There was only a need for one CDU design point in terms of heat removal and system water flow rates. However, with current and future systems occupying a single frame, a cooling unit may be called upon to support anywhere from 1 to n number of systems. More importantly, computer customers customarily choose to scale up their computing requirements as their needs grow by adding more electronics within a fame or adding additional electronics frames. It is highly desirable, therefore, to be able to scale up the function of a cooling distribution unit.

Power levels in computer equipment (primarily processors) have risen to the level where they can no longer be air cooled. These components will likely be water cooled. Heat dissipated by the processor will be transferred to the water via a water cooled cold plate. Water typically available at customer locations (i.e. data centers) is not suitable for use in these cold plates. First condensation formation is a concern as the temperature of the data center water, ranging from 7 C to 15 C, is fair below the room's dew point (typically 18–23 C). Second, the relatively poor quality of the water (its chemistry, cleanliness, etc.) impacts system reliability. It is therefore desirable to utilize a water cooling/conditioning unit that circulates high quality water to/from the electronics to be cooled and rejects the heat to the data center water.

It is also desirable to provide the water cooling function in a considerably smaller volume, preferably within a single 19" or 24" rack. It would help to utilize a plate heat exchanger in lieu of the bulky shell and tube heat exchangers used in past systems, but something more is needed in terms of volume reduction. Furthermore, it is desirable to avoid the extra expense and volume associated with insulating the heat exchanger to prevent condensation formation. While some attempt at space consolidation has been made in the past (e.g., as disclosed in patent application entitled "Cooling System for Portable Electronic and Computer Devices" by Richard C. Chu et al., Ser. No. 09/893,135, filed Aug. 17, 2001, and assigned to the assignee of the present invention, wherein an expansion space was provided within a heat exchanger in a personal computer environment), these did not deal with the rack-mounted frame environment nor take the novel approach presented herein.

SUMMARY

Disclosed herein is the concept of a Scalable Coolant Conditioning Unit (SCCU) which provides the means to scale the function of a CDU. This is accomplished by utilizing modular pumping units that can be added to the SCCU. Additionally, the SCCU takes advantage of an integral heat exchanger/expansion tank that is sized to handle the maximum design point. The modular pumping units are arranged in a parallel flow configuration; additional pumps provide additional flow at a consistent pressure drop. The alternative to this concept would be to design, build, and inventory multiple CDUs and swap in successively larger units as the customer's requirements grow. It is far more cost effective to apply the concept disclosed here utilizing one common unit with the capability of accommodating multiple pumping units to scale-up flow and cooling capability as the customer's requirements grow. The SCCU makes cooling water a customer supplied utility providing conditioned water (in terms of temperature and cleanliness) for cooling each flame as needed, much like a municipal water utility distributes water to each home as needed.

Also disclosed herein is the concept of physically integrating a plate beat exchanger within the expansion tank in order to reduce volume and prevent condensation formation on the heat exchanger without having to add bulky insulation.

The recitation herein of desirable objects which are met by various embodiments of the present invention is not meant to imply or suggest that any or all of these objects are present as essential features, either individually or collectively, in the most general embodiment of the present invention or in any of its more specific embodiments.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

A cooling unit similar to that depicted in FIG. 1 was used to cool IBM's large bipolar systems back in the 1980s and early 1990s. The cooling unit 11 was relatively large and occupied more than what would now be considered as two full electronics frames. Within the cooling unit was a power/control element 12, a reservoir/expansion tank 13, a heat exchanger 14, a pump 15 (often accompanied by a redundant second pump), customer water (or site or facility service water or coolant) in 16 and out 17 supply pipes, a supply manifold 18 directing water to the electronics frames 20, and a return manifold 19 directing water from the electronics frames 20.

Figure 2:
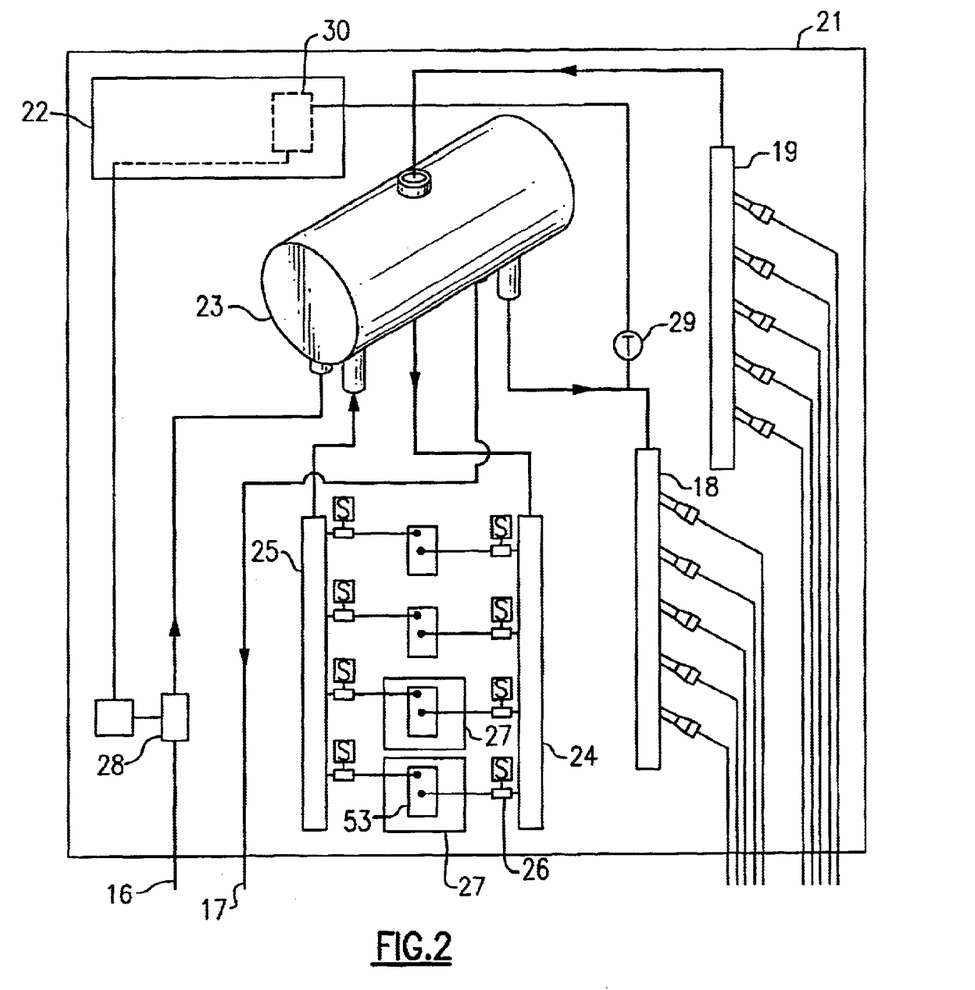
FIG. 2 is a schematic of the Scalable Coolant Conditioning Unit (SCCU) of the present invention.

In accordance with preferred embodiments of the present invention, FIG. 2 illustrates elements of the scalable SCCU 21 of the present invention. Within the unit is a bulk power regulator and controls 22. The coolant returning from the electronics frame 20 ("system coolant") is collected by a return manifold 19 and directed through the expansion tank section of the integral heat exchanger/expansion tank 23 (described more fully below) and to another manifold 24 which supplies the coolant to multiple modular pumping units (MPUs) 27. The higher pressure discharge of the MPUs is collected in another manifold 25 and directed to the "hot side" of the heat exchanger within the integral heat exchanger/expansion tank. The MPU's are connected to the manifolds via an insertion facilitation mechanism comprising automatic coupling assemblies 53 which are connected via flexible hoses to an isolation valve mechanism comprising a plurality of solenoid operated isolation valves 26. Alternatively, the isolation valves could be manually operated either locally or remotely, and the automatic coupling assemblies could be replaced by manually operated quick disconnects. Isolation valves 26 are connected to manifolds 24 and 25 for isolating MPU's from the manifolds during installation or removal. (Note: FIG. 2 is a schematic and is not meant to show the actual location of the quick disconnects on the MPU's. This will be shown in detail later, e.g., in FIGS. 7 and 8.) Having been cooled by the site (or "facility") service water flowing through the "cold side" of the heat exchanger (16, 17), the system liquid is sent to the supply manifold 18 which distributes the conditioned coolant to multiple electronics frames requiring cooling. Although not shown here, the SCCU may also incorporate means to filter the system water and automatically add a corrosion inhibitor such as benzotriazole (BTA) as needed. A two-way control valve 28 is used to regulate the flow rate of the customer water supplied to the heat exchanger within the integral heat exchanger/expansion tank, thereby controlling the temperature of system water delivered to the electronics frames 20. A thermistor temperature sensing element 29 located at the inlet of the system water supply manifold 18 supplies an electronic signal to circuitry 30 controlling the operation of two-way valve 28. If the supply water temperature is higher than desired, two-way valve 28 is commanded to open more allowing an increased flow of customer water through the heat exchanger resulting in a decrease in the temperature of the system water directed to the electronic frames from supply manifold 18. Alternatively, if the supply water temperature is lower than desired, two-way valve 28 is commanded to close more providing a decreased flow of customer water through the heat exchanger resulting in an increase in the temperature of the system water directed to the electronic frames from supply manifold 18.

Figure 3:
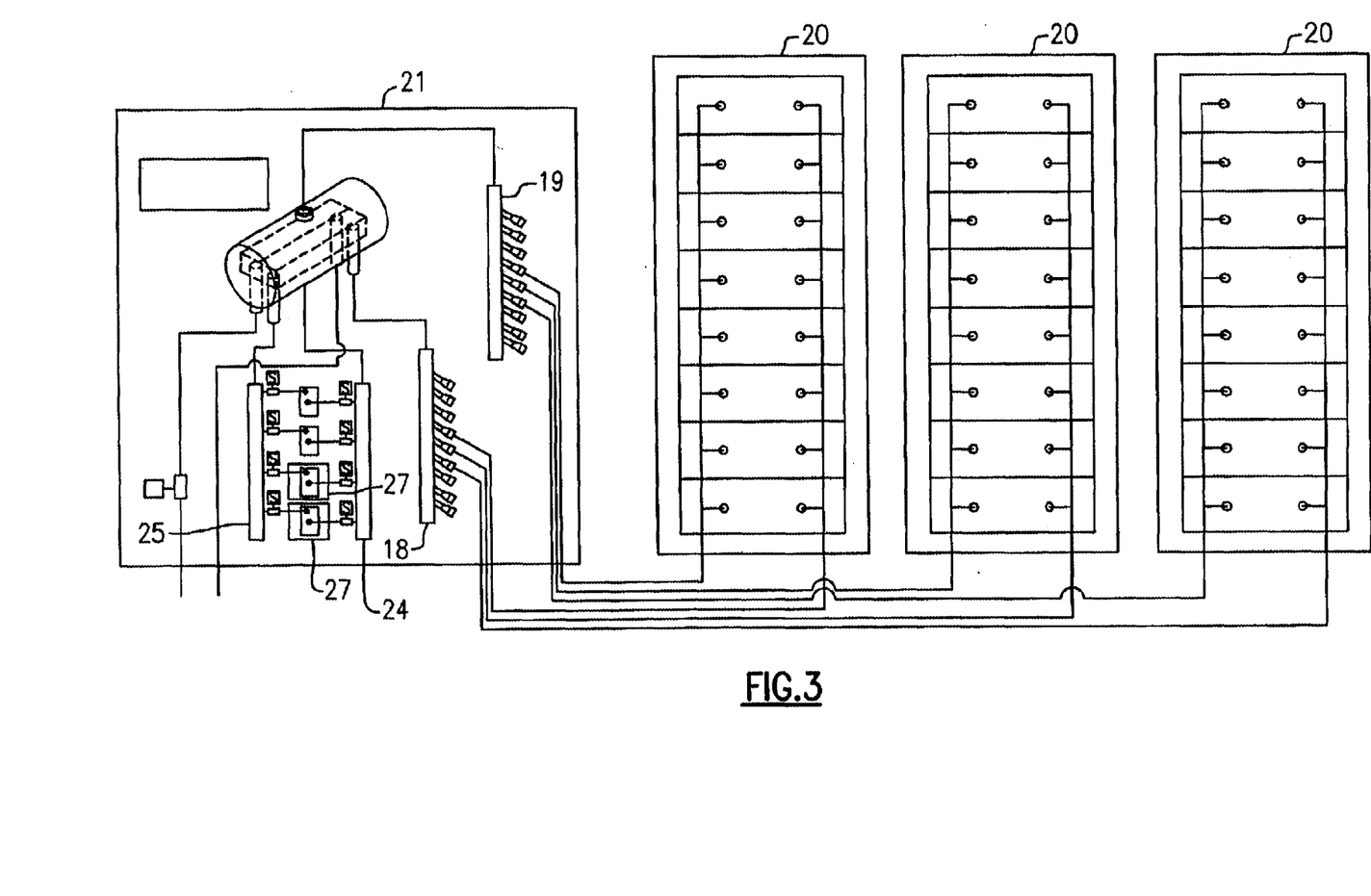
FIG. 3 shows an SCCU having a minimal number of pumps.
Figure 4:
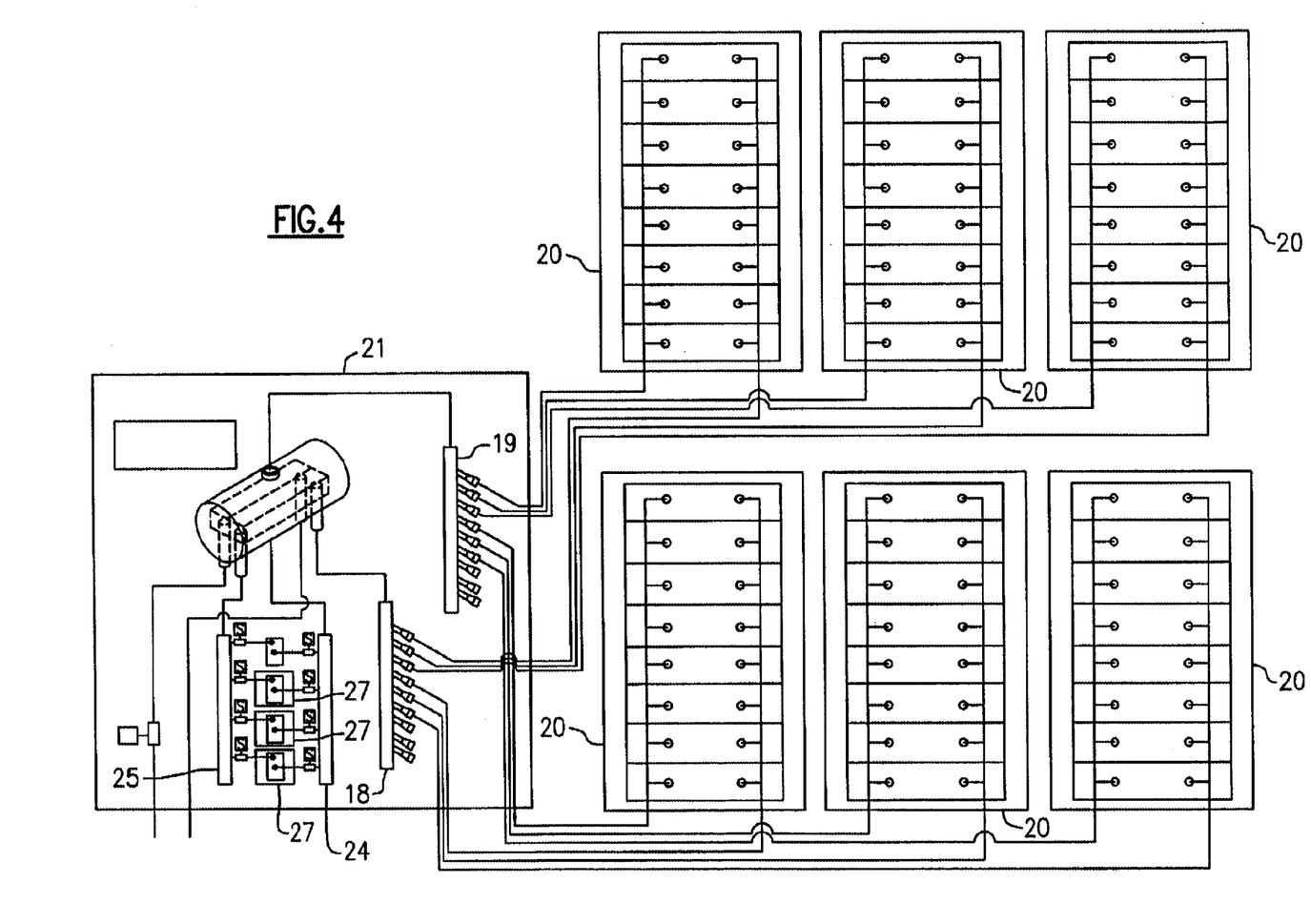
FIG. 4 shows an SCCU having an intermediate number of pumps.
Figure 5:
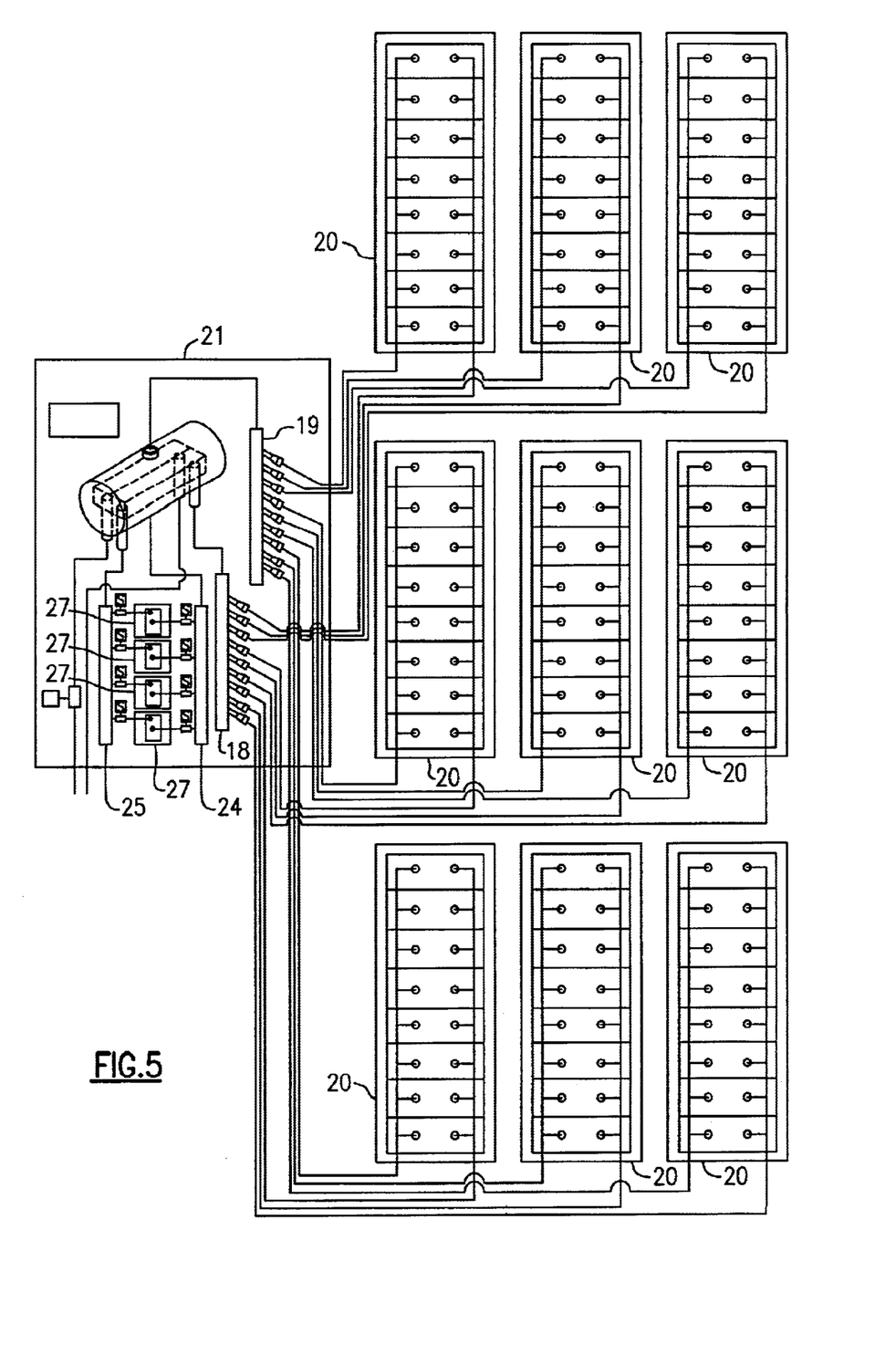
FIG. 5 shows an SCCU having a maximum number of pumps.

FIGS. 3, 4, and 5 illustrate different ranges of operation for the SCCU. FIG. 3 shows a minimal number of MPU's 27 coupled to manifolds 24 and 25, to accommodate a low system flow requirement (note the minimal number of connections to manifolds 18 and 19 because of low number of electronic frames 20 and the low heat load associated with these frames). FIG. 4 shows a greater number of MPU's 27 coupled to manifolds 24 and 25, to accommodate a moderate coolant flow requirement (note the greater number of connections to manifolds 18 and 19 because of an increased number of frames 20 and the greater heat load associated with these frames 20). FIG. 5 shows the maximum number (for this configuration) of MPU's 27 coupled to manifolds 24 and 25, to accommodate the high coolant flow (note the maximum (for this configuration) number of connections to manifolds 18 and 19 and maximum heat load associated with the maximum number of frames this configuration will support.

Figure 6A:
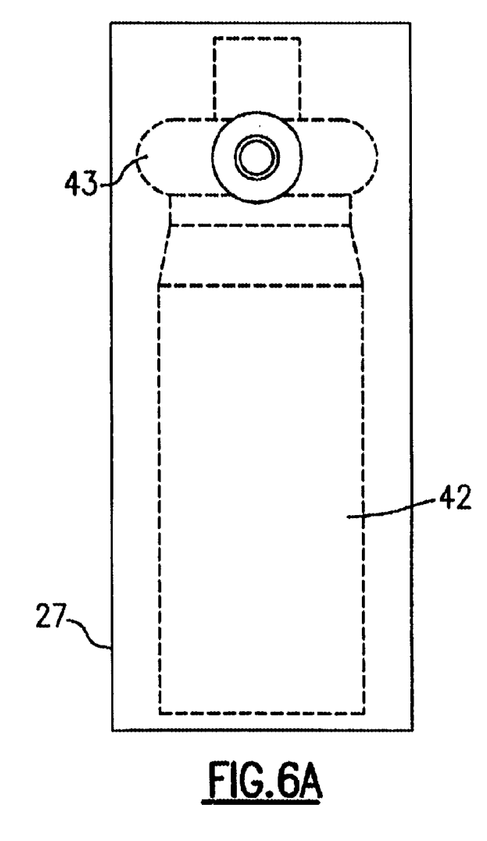
FIGS. 6A and 6B, respectively, show front and side views of a modular pumping unit (single in-line pump)
Figure 6B:
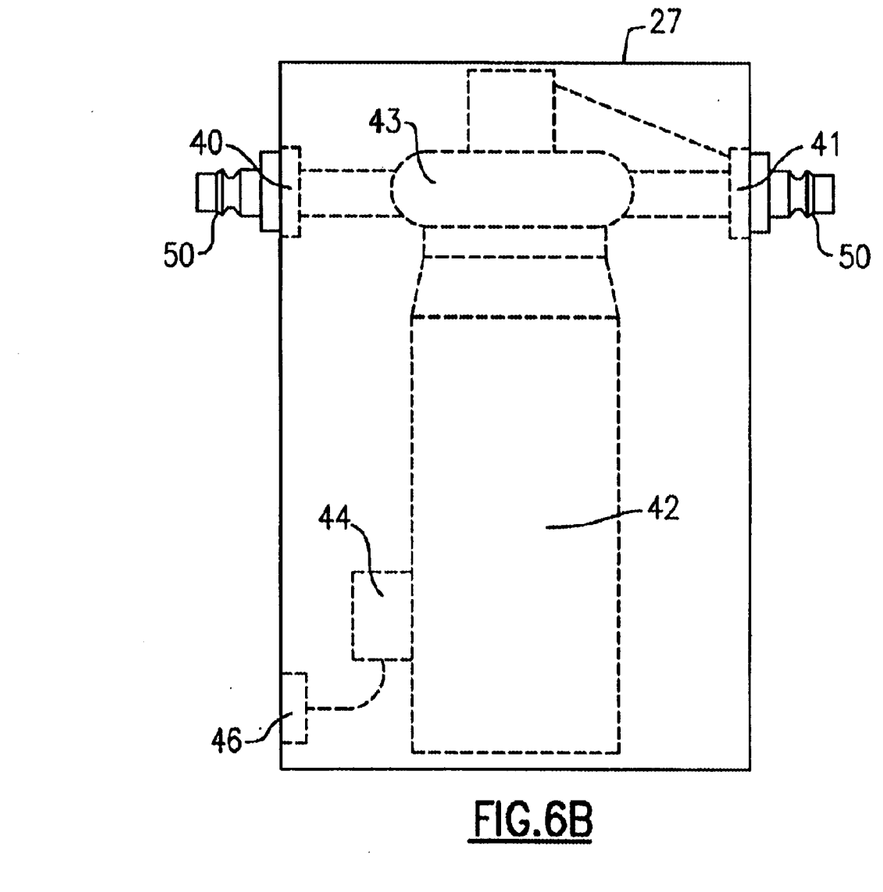

An important element to the scalable SCCU is the modular pumping unit 27. One or multiple pumps are housed in a package as illustrated in FIGS. 6A and 6B and FIGS. 7A and 7B, respectively. As shown in FIGS. 6A and 6B (front and side views, respectively and illustrating a single in-line centrifugal pump within an MPU), the pump motor 42 is disposed below the centrifugal pump 43. An example of the pump motor 42 and centrifugal pump 43 would be the Bell & Gossett (8200 N. Austin Ave, Morton Grove, Ill., 60053) Series 90 in-line mounted centrifugal pump. The suction 40 and discharge 41 of the pump are brought out to the outer boundary of the pumping unit 27, where they terminate in a male quick-disconnect fitting 50. An electrical connection 44 to the pump motor is in turn brought out to an external connection 46 on the outer boundary of the pumping unit.

Figure 7A:
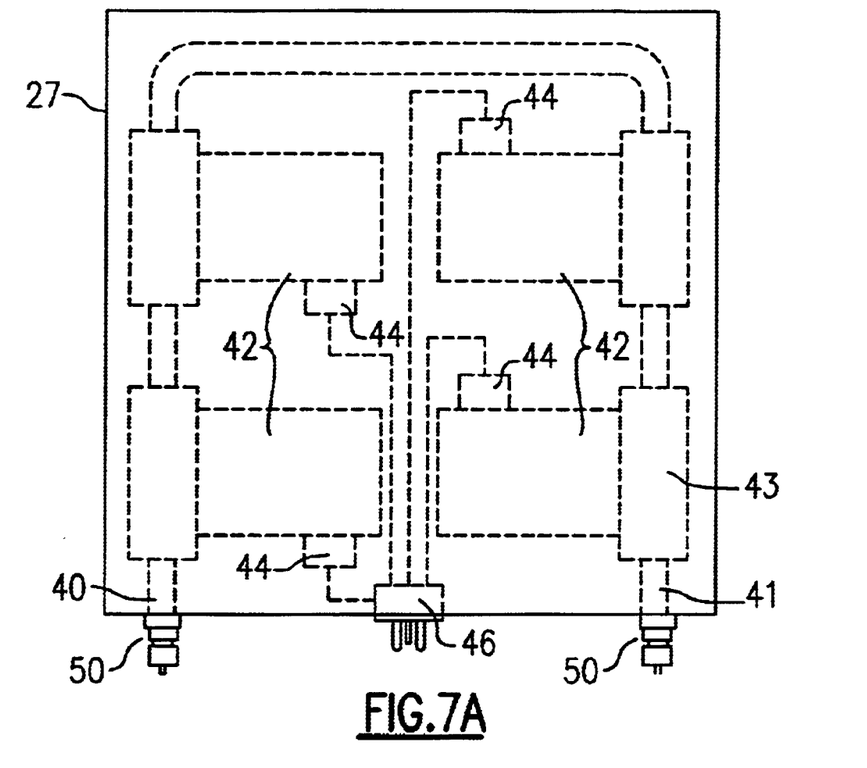
FIGS. 7A and 7B, respectively, show top and front views of a modular pumping unit (multiple in-line pumps)
Figure 7B:
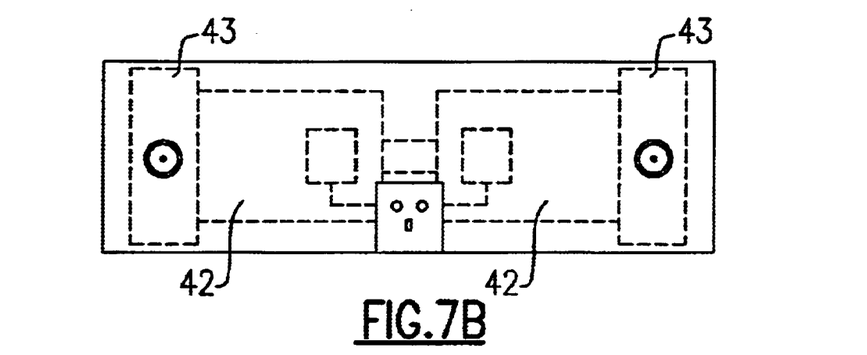

FIGS. 7A and 7B (top and front views, respectively) illustrate a modular pumping unit 27 having multiple in-line pumps (each comprising a pump motor 42 and centrifugal pump 43). Each pump motor has its own electrical connection 44, and all electrical connections are connected to external connection 46.

Figure 8A:
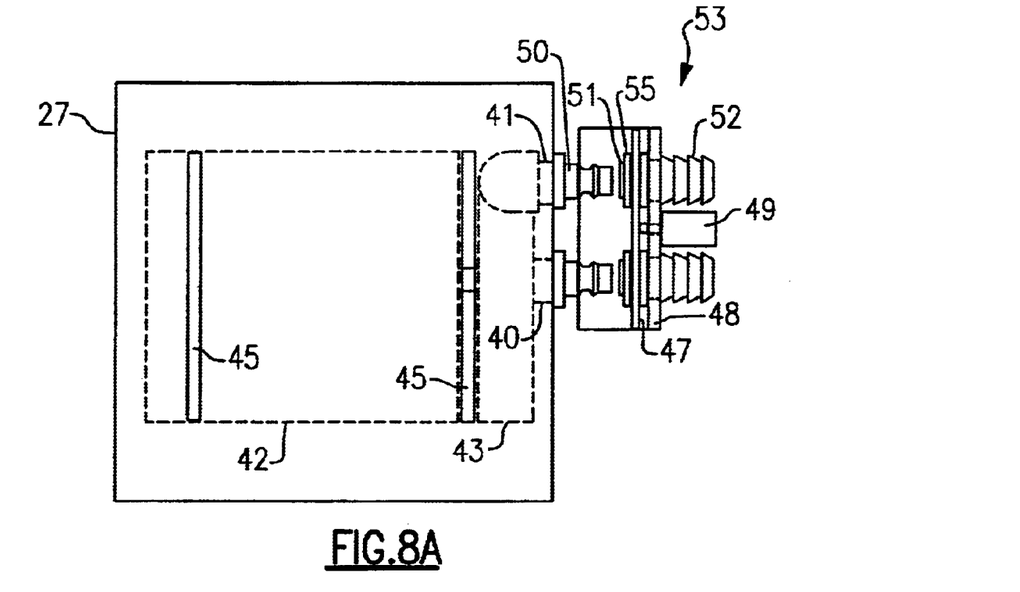
FIGS. 8A, 8B, and 8C, respectively, show top, side, and front views of a modular pump unit in position to be connected within an SCCU.
Figure 8B:
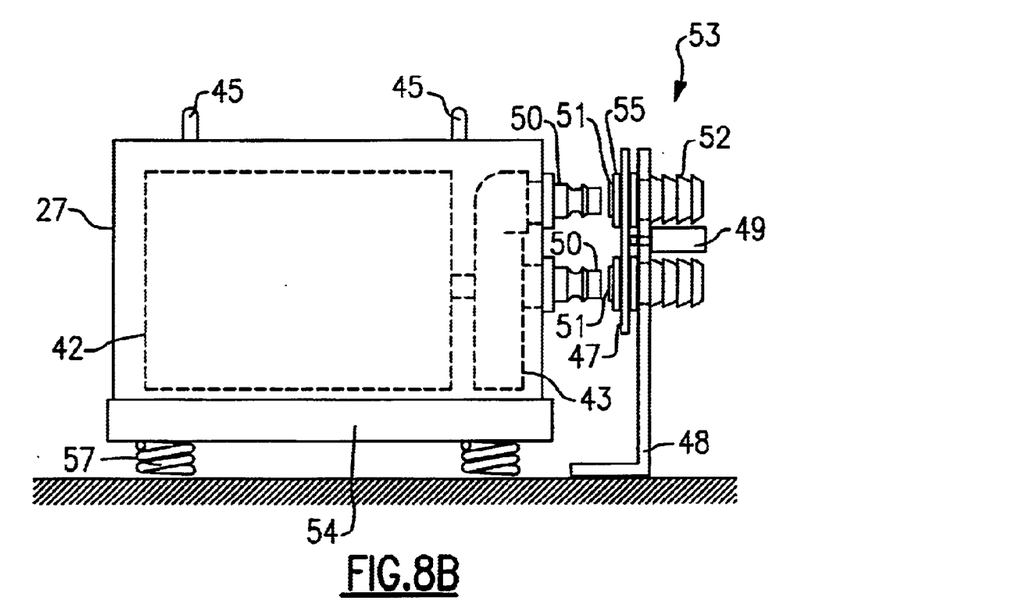
Figure 8C:
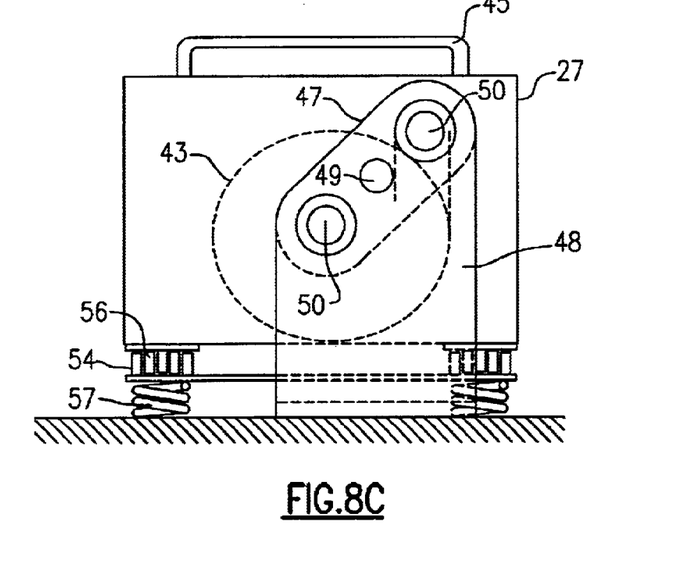

FIGS. 8A, 8B, and 8C show a modular pumping unit 27 in position to engage automatic coupling assembly 53 within an SCCU (top, side, and front views, respectively). The pump here is a volute centrifugal pump and is configured so that suction and discharge are on the same side of the MPU. It can be readily appreciated that multiple such pumps can be configured within the MPU as was described above in the case of the in-line configuration. The MPU is fitted with carrying handles 45 to facilitate transportation. The MPU is positioned within the SCCU atop an MPU mounting track 54, which is in turn connected to the SCCU body by a connection mechanism (shown as shock-absorbers 57 in FIGS. 8B and 8C). To facilitate seating the MPU atop the mounting plate, the MPU and mounting plate are outfitted with cooperating seating mechanism (shown in FIG. 8C as a set of rollers 56 affixed to the MPU, seated within mounting track 54 affixed to the mounting plate). Rollers 56 allow the MPU to be rolled into position to engage or disengage automatic coupling assembly 53 comprised of mounting bracket 48 affixed to SCCU, female quick-disconnect fittings 51, actuation plate 47, and actuation solenoid 49. Female quick-disconnect fittings 51 are held in a stationary position by mounting bracket 48. Flexible hoses (not shown) attached to hose barbs 52 connect to solenoid-operated isolation valves (26 in FIG. 2 on manifolds 24 and 25). The locking-release collar 55 of female-quick disconnects 51 is retained in actuation plate 47 which is connected to the shaft of actuation solenoid 49. Energizing actuation solenoid 49 causes actuation plate 47 and locking collar 55 of the female quick-disconnects 51 to move towards mounting bracket 48. Movement of locking-release collars 55 to the right in FIG. 8A permits male quick-disconnects 50 to engage or disengage female quick-disconnects 51. Alternatively, electrically operated actuation solenoid 49 could be replaced with a manually operated actuation mechanism in FIGS. 8A, 8B, and 8C.

Following is a description of the sequence of actions/events involved in installing or removing an MPU (utilizing the insertion facilitation mechanism comprising an electrically actuated automatic coupling assembly 53 and isolation valve mechanism comprising electrically operated solenoid isolation valves 26) while an SCCU continues to operate:

1. Status of relevant SCCU components prior to modular pumping unit (MPU) installation or removal:

Applicable solenoid-operated isolation valves (SOIV's) 26 are in their normal (non-actuated) position which is open.

Applicable actuation solenoid (AS) 49 is in its normal position (when the actuation solenoid 49 is in its normal position, the locking-release collars on the female portion of the quick disconnects are in their normal locked position.)

2. Sequence of events when an MPU is installed in an operating SCCU:

a) Stimulus is applied to ready MPU location for MPU install. Thus stimulus could be the entering of a computer command (when microcode controlled) or manual operation of an electrical switch. Two things happen when this stimulus is provided (in order):
        i) Applicable SOIV's 26 are electrically energized (closed)
        ii) Applicable AS 49 is electrically energized (unlocking locking-release collar of female quick disconnect).
    b) Install MPU by manually pushing (from left-side in FIG. 8A) into position (resulting in insertion of male portion of quick disconnect into female portion of quick disconnect)
    c) Apply separate stimulus to ready MPU for operation in the SCCU resulting in (in order)
        i) Applicable AS 49 being electrically de-energized (locking-release collar on female portion of quick disconnect returns (under spring load) to its normal locked position)
        ii) Applicable SOIV's 26 electrically de-energized (opened)

3. Sequence of events when a MPU is removed while SCCU is operating.
    a) Stimulus is applied to ready MPU location for MPU removal resulting in (in order)
        i) Applicable SOIV's 26 being electrically energized (closed)
        ii) Applicable AS 49 being electrically energized
    b) Remove WU (by manually pulling towards left-side in FIG. 8A)
    c) Apply separate stimulus to acknowledge MPU has been removed resulting in (in order)
        i) Applicable AS 49 electrically de-energized
        ii) Applicable SOIV's 26 electrically de-energized (closed)

It may be appreciated that alternatively install and un-install of MPUs may be accomplished by manually coupling and uncoupling male quick disconnects 50 and female quick disconnects 51 and replacing of solenoid-operated isolation valves 26 with manually operated valves.

It will be appreciated by those skilled in the art that wherein the Scalable Cooling Conditioning Unit has been described herein with respect to water-cooling, the concept is readily adapted to use other types of coolant (e.g. brines, fluorocarbon liquids, or other similar chemical coolants) on the system-side while maintaining the advantages and unique features of this invention.

Figure 9:
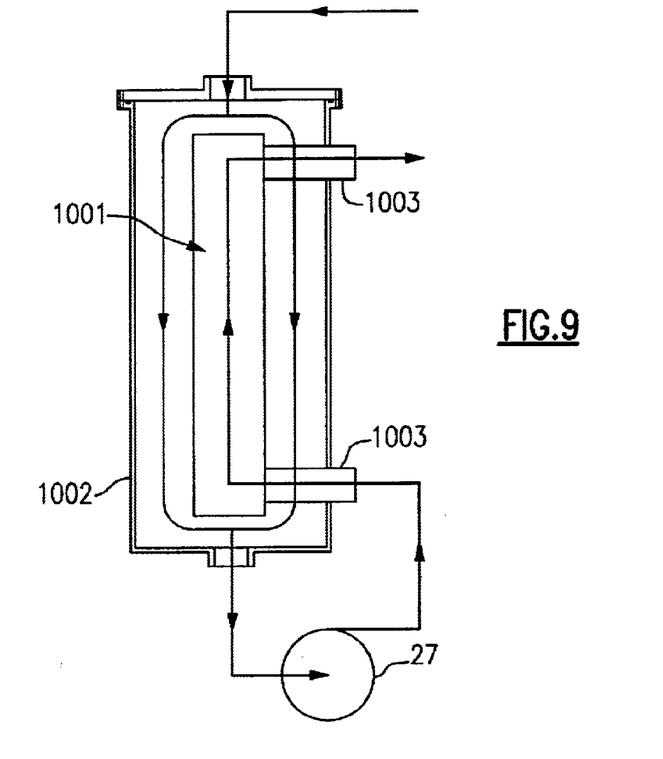
FIG. 9 is a conceptual drawing of an integrated plate heat exchanger and expansion tank (customer water side not shown)
Figure 10:
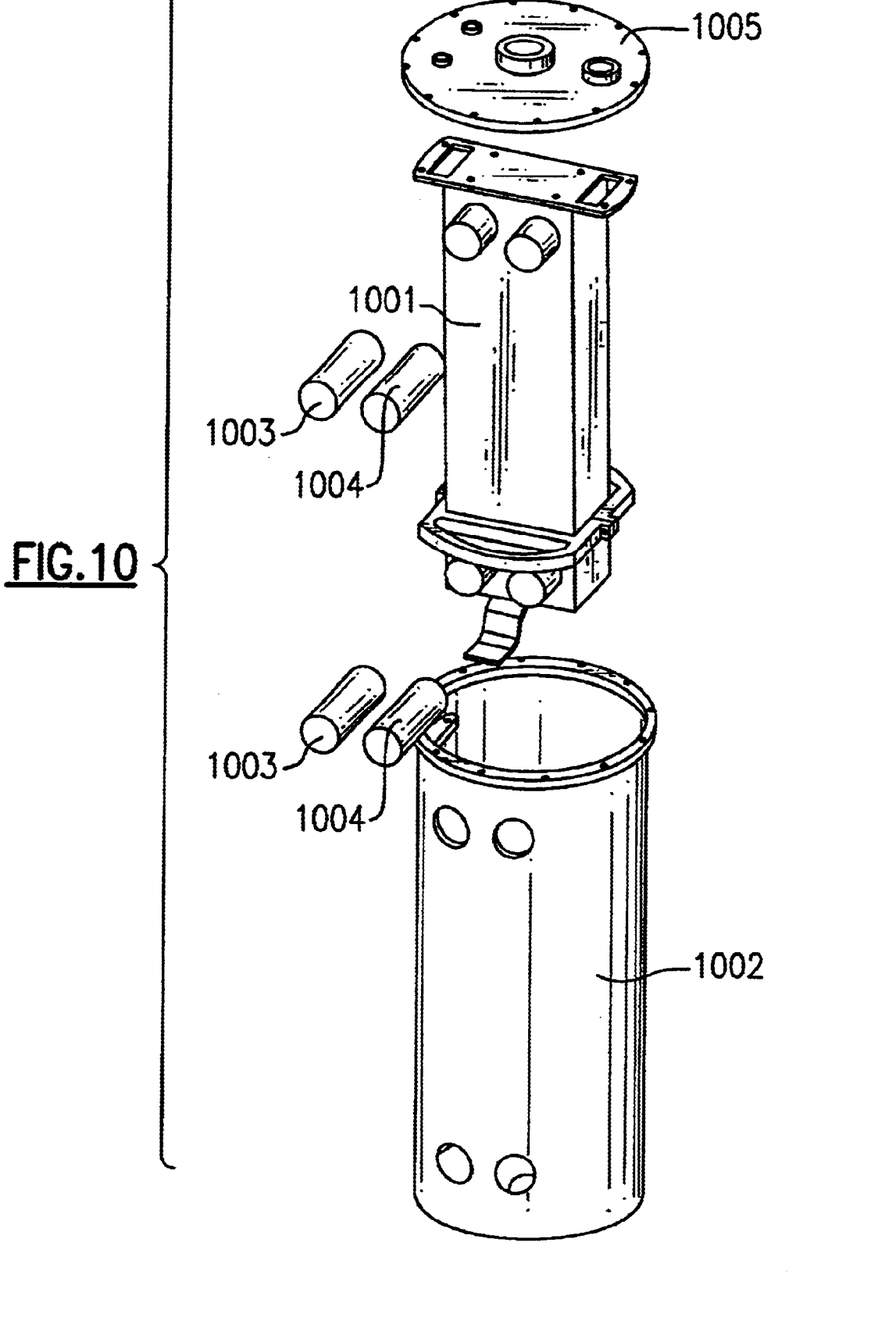
FIG. 10 is an exploded view (isometric) of an integral plate heat exchanger/expansion tank.

The overall concept of a physically integrated plate heat exchanger/expansion tank can be seen in FIG. 9. Closed liquid loops typically require an expansion space or tank to account for the volumetric expansion of the liquid under varying environmental temperatures and/or the volumetric expansion of flexible (i.e., rubber) hoses when exposed to operating pressures. It should be noted that the size and cooling capacity of the integrated plate heat exchanger/expansion tank is set to accommodate the maximum heat load of the SCCU system (i.e., the load with all possible MPU's attached to the appropriate manifolds). The plate heat exchanger 1001 exists completely within the tank 1002. The piping to 1003/from 1004 the heat exchanger penetrates the tank wall. The structure can be assembled in a number of ways. An example is shown in FIG. 10. A cover 1005 is attached to the tank after the heat exchanger is placed within the tank, and the piping 1003/1004 is attached to the heat exchanger after the heat exchanger is placed inside the tank. Since the plate heat exchanger and tank are made of stainless steel, the pipe can be welded to the tank wall to prevent leakage.

Figure 11:
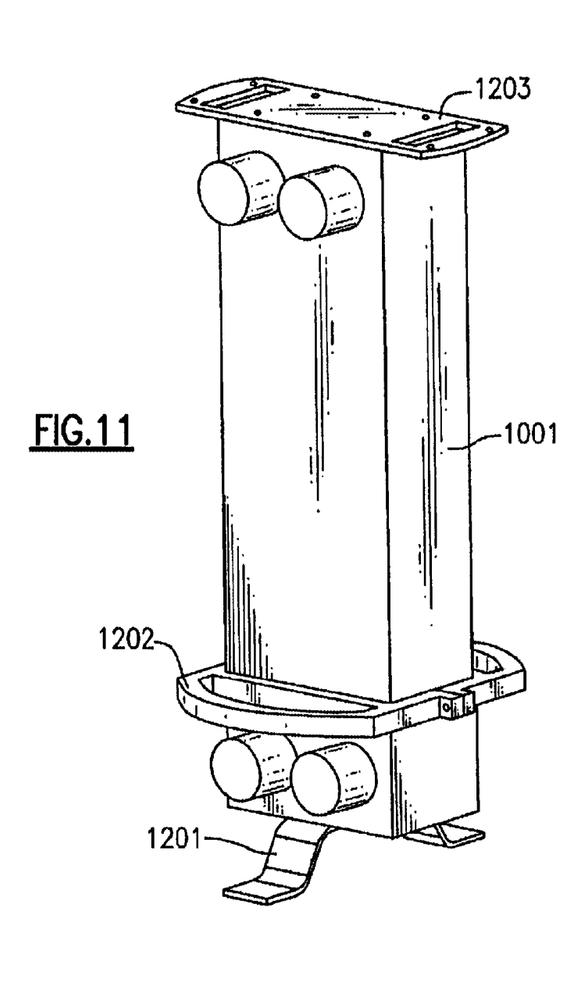
FIG. 11 is a plate heat exchanger with supports for mounting a heat exchanger inside the tank.
Figure 12:
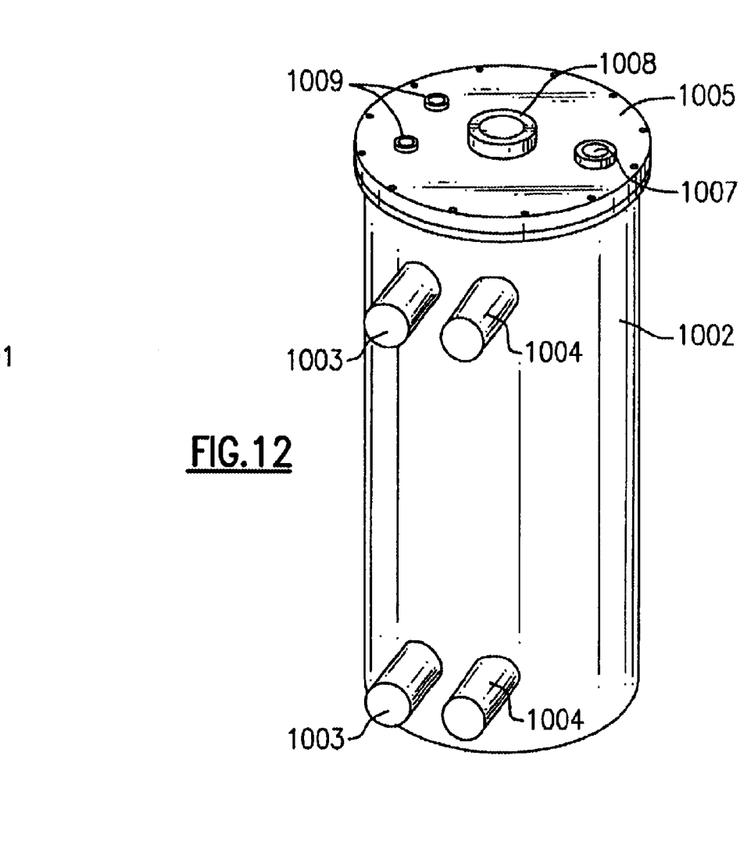
FIG. 12 is an isometric of an assembled integral plate heat exchanger/expansion tank.

As shown in FIG. 10, a heat exchanger subassembly is made up of a plate heat exchanger 1001 with supports mounted to it. The detailed supports can be seen in FIG. 11. The axial (bottom) support 1201 would be designed to act as a spring so as to provide vertical compliance in the assembly. The lateral support 1202 would be designed to prevent lateral motion of the heat exchanger. A rubber gasket around the periphery of the lateral support (not shown) would provide lateral compliance during assembly. A top mounting plate 1203 would be bolted to supports provided on the tank to anchor the beat exchanger within the tank. FIG. 11 shows the completed assemblage of the expansion tank with the heat exchanger within.

It has been shown, with a finite element thermal conduction analysis, that the warm water return from the electronics frame(s) prevents the tank walls from dropping below the dew point temperature therefore preventing condensation from forming on the outer walls. Additionally, it can be shown that to contain a 24.33" long by 7.52" wide by 4.41" deep heat exchanger in an expansion tank 28.33" long and provide 10 gallons worth of expansion volume requires a 12" diameter tank versus a 10-gallon expansion tank (alone) 28.33" long that must be 10.3" in diameter. Factor in a minimum of 1" insulation that would have to surround the heat exchanger if not mounted inside the expansion tank and the volume benefit associated with the integral concept becomes self evident.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A scalable coolant conditioning unit (SCCU) comprising:
    a) an expansion tank having an intake opening connected to and receiving system coolant fluid from one or more electronics frames being cooled, and an outlet opening connected to and directing coolant fluid to a first manifold;
    b) two or more modular pumping units (MPU's) comprising at least one pump/pump motor combination and disposed between the outlet opening and a plate heat exchanger, the MPU's each being connected on an intake side to the first manifold, and being connected on an outlet side to a second manifold, the connections to the manifolds being made by an insertion facilitation mechanism; and
    c) said plate heat exchanger having an in and an out opening for receiving and discharging said system coolant, having a hot-side opening for receiving said system coolant from the MPU's, and a cool-side opening for discharging said system coolant towards the electronics frames; and said plate heat exchanger further having an in and an out opening for receiving and discharging facility service coolant.

2. The SCCU of claim 1 in which the plate heat exchanger is integrally disposed within the expansion tank.

3. The SCCU of claim 1 in which the MPU's are connected to the body of the SCCU by a seating mechanism comprising a set of rollers affixed to the MPU's and a mounting track configured to receive said rollers, said mounting track attached to a mounting plate, said mounting plate being attached to the SCCU body by a connection mechanism.

4. The SCCU of claim 3 in which the connection mechanism comprises shock absorbers.

5. The SCCU of claim 1 in which the insertion facilitation mechanism comprises an automatic coupling assembly.

6. The SCCU of claim 5 in which said automatic coupling assembly comprises two female quick-disconnect fittings each having a movable locking collar, a mounting bracket retaining said two female quick disconnect fittings and affixed to the SCCU body, an actuation plate affixed to the locking collars, and an actuation solenoid connected to said mounting bracket and said actuation plate and capable of moving said actuation plate and thereby said locking collars into engagement with a male intake valve and a male outlet valve on said MPU's.

7. The SCCU of claim 1 in which the insertion facilitation mechanism comprises an isolation valve mechanism.

8. The SCCU of claim 6 in which the insertion facilitation mechanism further comprises an isolation valve mechanism disposed between the automatic coupling assembly and the manifolds, said isolation valve mechanism comprising an isolation valve connected to and operated by a solenoid.

9. The SCCU of claim 1 in which at least one MPU comprises a plurality of pump/pump motor combinations.

10. The SCCU of claim 1 in which a control valve regulates the flow rate of the facility service coolant in response to a temperature sensing element.

11. An integral plate heat exchanger/expansion tank for use in a coolant conditioning unit for cooling one or more electronics frames comprising:
    a) an expansion tank having an intake opening connected to and receiving system coolant fluid from one or more electronics frames being cooled, and an outlet opening connected to and directing coolant fluid to a first manifold; and
    b) a plate heat exchanger integrally disposed within the expansion tank, the plate heat exchanger having an in and an out opening for receiving and discharging facility service coolant, and also having a hot-side opening for receiving said system coolant that has passed through and absorbed heat from the one or more electronics frames, and having a cool-side opening for discharging said system coolant towards the one or more electronics frames.

12. The integral plate heat exchanger/expansion tank of claim 11 in which the plate heat exchanger is insulated only by the surrounding coolant within the expansion tank and not by any other insulating material.

13. A method of increasing the cooling capacity of an operating Scalable Coolant Conditioning Unit (SCCU) comprising the steps of
    a) obtaining an additional Modular Pumping Unit (MPU) comprising at least one pump/pump motor combination; and
    b) placing the MPU into operation within the SCCU using a seating mechanism and an insertion facilitation mechanism.

14. The method of claim 13 in which the seating mechanism comprises a set of rollers affixed to the MPU and a mounting track configured to receive said rollers, said mounting track attached to a mounting plate, said mounting plate being attached to the SCCU body by a connection mechanism.

15. The method of claim 13 in which the insertion facilitation mechanism comprises an automatic coupling assembly said automatic coupling assembly comprising two female quick-disconnect fittings each having a movable locking collar, a mounting bracket retaining said two female quick disconnect fittings and affixed to the SCCU body, an actuation plate affixed to the locking collars, and an actuation solenoid connected to said mounting bracket and said actuation plate and capable of moving said actuation plate and thereby said locking collars into engagement with a male intake valve and a male outlet valve on said MPU.

16. The method of claim 13 in which the insertion facilitation mechanism comprises an isolation valve mechanism.

17. The method of claim 16 further comprising the step of:
    before the step of placing the MPU into operation, applying a stimulus which energizes the isolation valve mechanism and closes an isolation valve, and which then energizes the actuation solenoid to unlock the locking collars.

18. The method of claim 17 in which the step of placing the MPU into operation further comprises the step of:
    applying a separate stimulus to ready the MPU for operation resulting in de-energizing the actuation solenoid to lock the locking cars, and then de-energizing the isolation valve mechanism to open the isolation valve.

19. The method of claim 13 in which at least one MPU comprises a plurality of pump/pump motor combinations.

* * * * *